(12) United States Patent
Hayashi (10) Patent No.: US 8,872,218 B2
(45) Date of Patent: Oct. 28, 2014

(54) MOLDED PACKAGE AND LIGHT EMITTING DEVICE

(71) Applicant: Nichia Corporation, Tokushima (JP)

(72) Inventor: Hideki Hayashi, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 13/855,745

(22) Filed: Apr. 3, 2013

(65) Prior Publication Data
US 2013/0264604 A1 Oct. 10, 2013

(30) Foreign Application Priority Data

Apr. 6, 2012 (JP) ................... 2012-087586

(51) Int. Cl.
H01L 33/00 (2010.01)
H01L 33/48 (2010.01)
H01L 33/54 (2010.01)
H01L 33/62 (2010.01)

(52) U.S. Cl.
CPC .............. *H01L 33/54* (2013.01); *H01L 33/486* (2013.01); *H01L 33/62* (2013.01); *H01L 2224/48247* (2013.01); *H01L 2224/48091* (2013.01)
USPC .................. 257/99; 257/88; 438/26

(58) Field of Classification Search
USPC ................. 257/88, 99, 100, E33.058; 438/26
See application file for complete search history.

(56) References Cited

U.S. PATENT DOCUMENTS

| 2004/0159850 A1* | 8/2004 | Takenaka ..................... 257/98 |
| 2008/0037252 A1* | 2/2008 | Nii et al. ..................... 362/267 |
| 2008/0237627 A1 | 10/2008 | Kobayakawa | |
| 2009/0065882 A1* | 3/2009 | Shirasaka ..................... 257/415 |
| 2010/0314654 A1 | 12/2010 | Hayashi | |

FOREIGN PATENT DOCUMENTS

| JP | 2003-110145 | 4/2003 |
| JP | 2006-222454 | 8/2006 |
| JP | 2008-251937 | 10/2008 |
| JP | 2010-199253 | 9/2010 |
| WO | WO 2008/081794 A1 | 7/2008 |

* cited by examiner

*Primary Examiner* — Phuc Dang
(74) *Attorney, Agent, or Firm* — Antonelli, Terry, Stout & Kraus, LLP.

(57) ABSTRACT

A molded package, including: a molded resin having a recess for accommodating a light emitting element; and a lead disposed at a bottom of the molded resin, a part of one surface of the lead being exposed from a bottom surface of the recess of the molded resin, the other surface of the lead including an exposed part and a lead recess, the exposed part being exposed from a rear surface of the molded resin, the lead recess being filled with a resin fully covering an inner surface thereof, the lead including a cutout or a through hole extending from the one surface to the other surface, a first edge of the cutout or the through hole closer to a center of the recess at the other surface being located inside the lead recess and covered with the resin.

24 Claims, 9 Drawing Sheets

MOLDED PACKAGE AND LIGHT EMITTING DEVICE

CROSS-REFERENCE TO RELATED APPLICATIONS

The present application claims priority under 35 U.S.C. §119 to Japanese Patent Application No. 2012-87586, filed on Apr. 6, 2012. The contents of this Japanese patent application are incorporated herein by reference in their entirety.

BACKGROUND OF THE INVENTION

1. Field of the Invention

The present invention relates to a molded package and a light emitting device.

2. Description of the Related Art

A light emitting device using a frame insert type resin package tends to accumulate heat generated by a light emitting element in the resin package, and it is thus required to improve heat dissipation properties of the light emitting device. If the frame insert type resin package has leads that are exposed from a rear surface of the resin package, the leads easily separate from a molded resin of the resin package. It is thus required to improve adhesiveness between the molded resin and the leads.

JP 2008-251937A discloses a resin packages having improved heat dissipation properties, in which leads are exposed from the rear surface of a molded resin so that heat generated by a light emitting element mounted in a recess of the resin package can be effectively discharged through the leads to a mounting substrate.

JP 2003-110145A discloses configurations for improving adhesiveness between a molded resin and lead, in which a metal plate is provided with a recess formed on a vertical side (lateral cutout) and a recess formed on a horizontal bottom (bottom recess). These recesses are covered with a molded resin so as to allow the molded resin to hold the lead.

These light emitting devices using the resin package are mounted on the mounting substrate with solder paste.

SUMMARY OF THE INVENTION

According to one aspect of the present invention, a molded package including:

a molded resin having a recess for accommodating a light emitting element; and a lead disposed at a bottom of the molded resin, a part of one surface of the lead being exposed from a bottom surface of the recess of the molded resin, the other surface of the lead including an exposed part and a lead recess, the exposed part being exposed from a rear surface of the molded resin, the lead recess being filled with a resin fully covering an inner surface thereof, the lead including a cutout or a through hole extending from the one surface to the other surface, a first edge of the cutout or the through hole closer to a center of the recess at the other surface being located inside the lead recess and covered with the resin.

According to another aspect of the present invention, a light emitting device includes:

the molded package;

a light emitting element being accommodated in the recess formed on the molded resin of the molded package and mounted on the one surface of the lead exposed from the bottom surface of the recess; and a sealing resin for sealing the light emitting element and the recess of the molded resin.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

The embodiments will now be described with reference to the accompanying drawings, wherein like reference numerals designate corresponding or identical elements throughout the various drawings.

[First Embodiment]

Figure 1A:
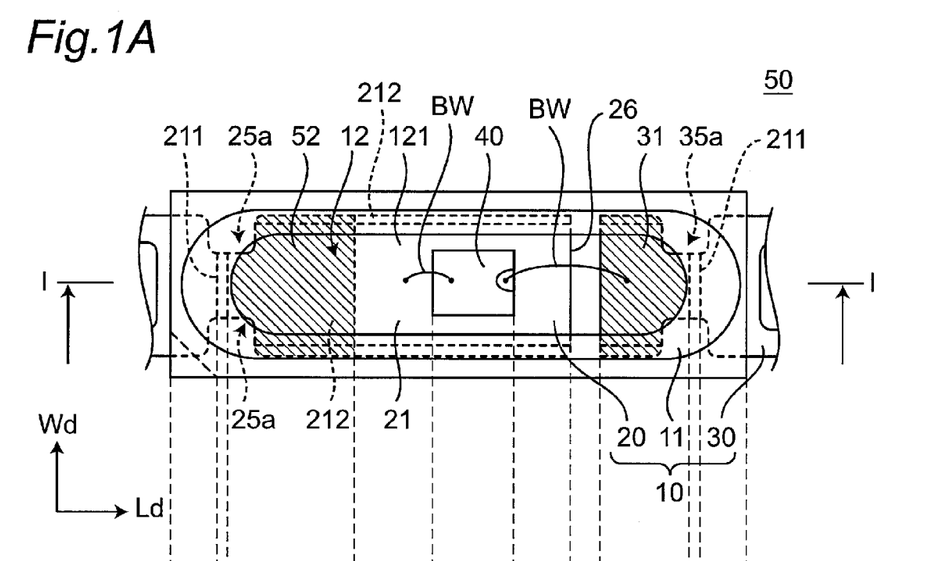
FIG. 1A is a top view of a light emitting device according to a first embodiment.
Figure 1B:
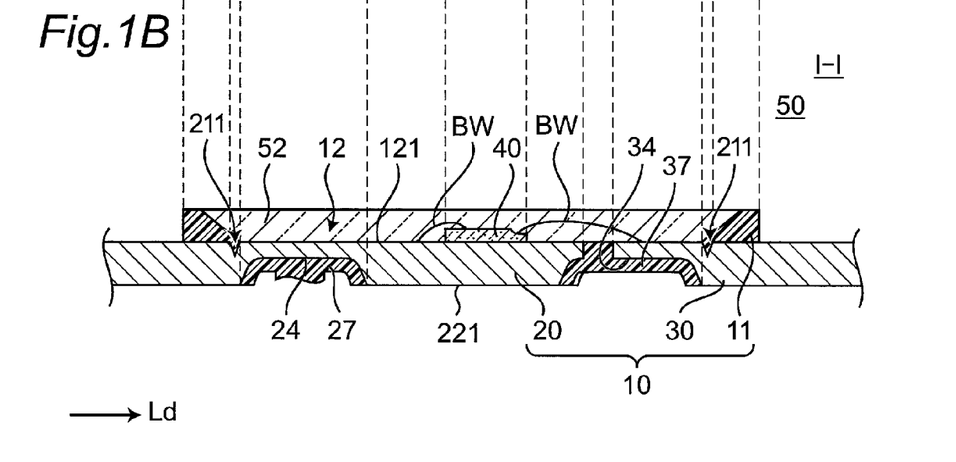
FIG. 1B is a cross-sectional view of the light emitting device according to the first embodiment taken along line I-I.

As shown in FIG. 1, a light emitting device 50 according to the present embodiment includes a molded package 10 that includes at least one lead (there are two leads 20 and 30 in FIG. 1) and a molded resin 11, a light emitting element 40, and a sealing resin 52.

The light emitting element 40 is accommodated in a recess 12 provided to the molded resin 11 of the molded package 10, and is mounted on a front surface 21 of the lead (first lead 20 in FIG. 1) exposed from a bottom surface 121 of the recess 12. The light emitting element 40 has a pair of electrodes, and one and the other electrodes are electrically connected to the first lead 20 and second lead 30 with bonding wires (BWs) respectively.

The sealing resin 52 seals the recess 12 of the molded resin 11 where the light emitting element 40 is accommodated, and protects the light emitting element 40 from external environment.

As shown in FIGS. 2A to 4B, the molded package 10 has an elongated shape in one direction (a Ld direction), and includes the molded resin 11 and at least one lead (the two leads 20 and 30 in the present embodiment) that is disposed at a bottom of the molded resin 11.

the molded resin 11 has the recess 12 on the upper surface to accommodate the light emitting element, the recess 12 being surrounded by a side wall 13.

The lead includes the first lead 20 and the second lead 30.

One surface (a front surface 21) of the first lead 20 is partially exposed from the bottom surface 121 of the recess 12 of the molded resin 11. The other surface (a rear surface 22) of the first lead 20 includes an exposed part 221 and a lead recess 24, the exposed part 221 being exposed from the rear surface 14 of the molded resin 11. The lead recess 24 is filled with a resin 27 and an inner surface of the lead recess 24 is fully covered with the resin 27.

Since the rear surface 22 of the first lead 20 is exposed from the rear surface 14 of the molded resin 11, heat generated by the light emitting element 40 is transferred from the front surface 21 to the rear surface 22 of the first lead 20, and then effectively dissipated from the rear surface 22 to outside (e.g. to a mounting substrate on which the light emitting device is mounted).

As with the first lead 20, one surface (a front surface 31) of the second lead 30 is partially exposed from the bottom surface 121 of the recess 12 of the molded resin 11, and the other surface (a rear surface 32) thereof is exposed from the rear surface of the molded resin 11. An inner surface of a lead recess 34 is covered with a resin 37.

The first and second leads 20 and 30 are separated from each other, and the molded resin 11 fills a gap between them.

Figure 3A:
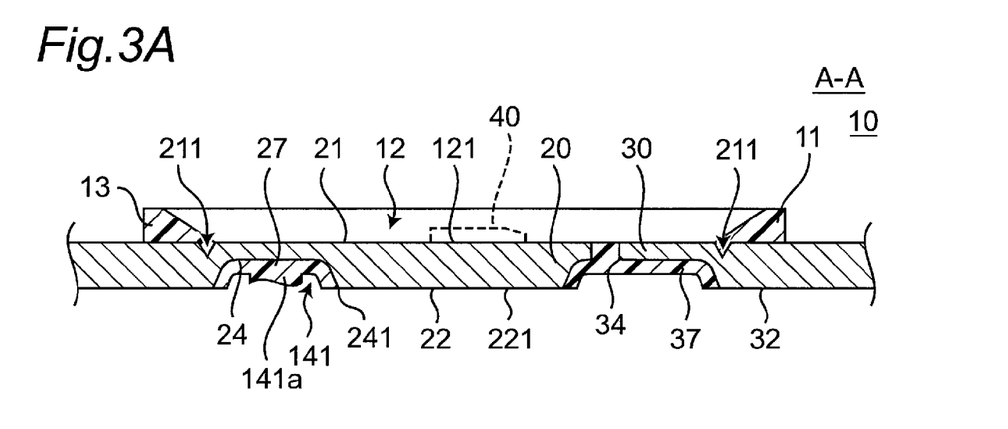
FIG. 3A is a cross-sectional view taken along line A-A of FIGS. 2A to 2C.
Figure 3B:
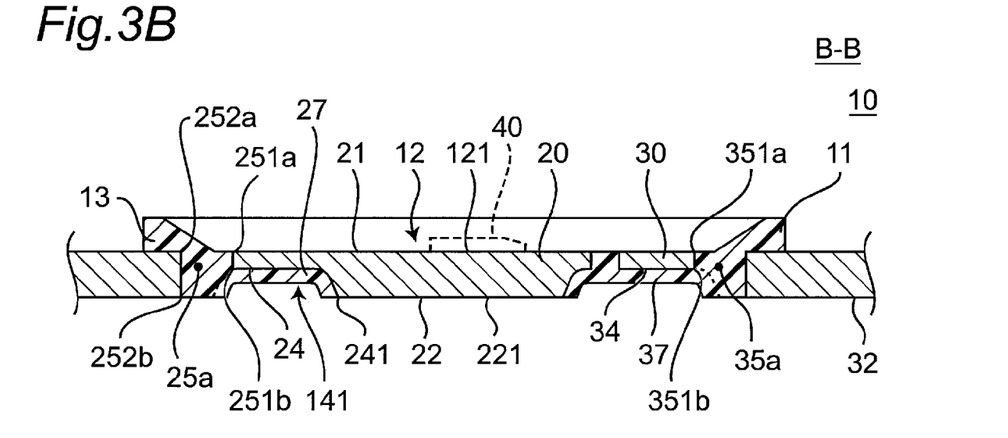
FIG. 3B is a cross-sectional view taken along line B-B of FIGS. 2A to 2C.

As shown in FIGS. 1 and 3 etc., the first and second leads 20 and 30 are tabular. The first and second leads 20 and 30 are not bent substantially. That is, the one surfaces (front surfaces 21 and 31) of the first and second leads 20 and 30 are almost flat, i.e., substantially planar, if the grooves (described hereinafter), which are formed intentionally, are not considered, and the other surfaces (rear surfaces 22 and 32) of the first and second leads 20 and 30 are almost flat if the lead recesses 24 and 34, which are formed intentionally, are not considered. For example, the portion of the front surface 21 of the first lead 20 at the mounting position of the light emitting element 40 is on the same plane as the portion of the front surface 21 of the first lead 20 overlying the lead recess 24. Thereby, the molded package 10 can be formed in a thin shape. Moreover, it is easy to shorten the heat abstraction way from the light emitting element 40 through the first and second leads 20 and 30, and the heat generated by the light emitting element 40 can be effectively dissipated.

Figure 2A:
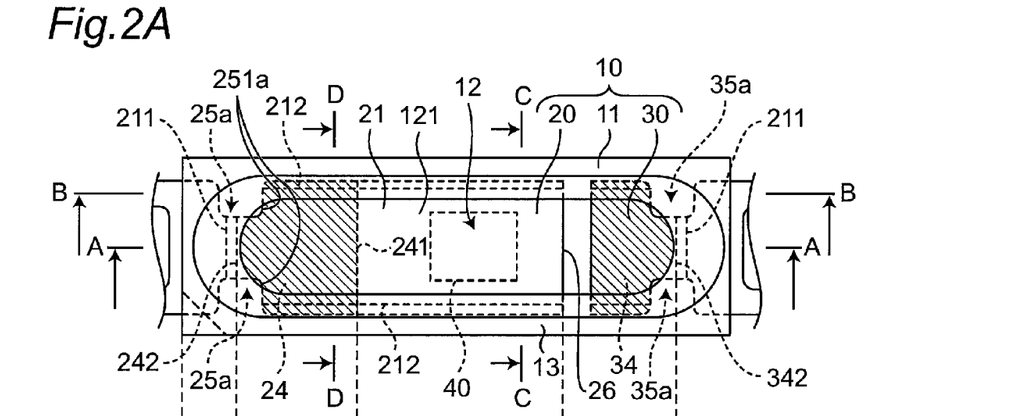
FIG. 2A is a top view of a molded package according to the first embodiment.
Figure 2B:
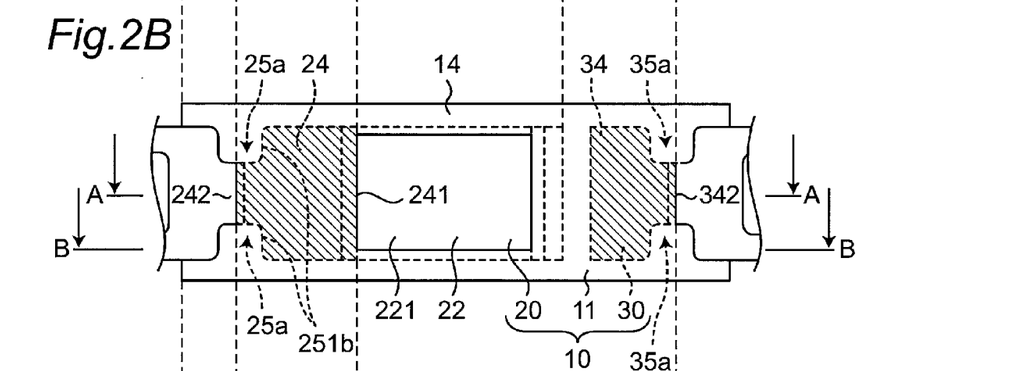
FIG. 2B is a bottom view of the molded package according to the first embodiment.
Figure 2C:
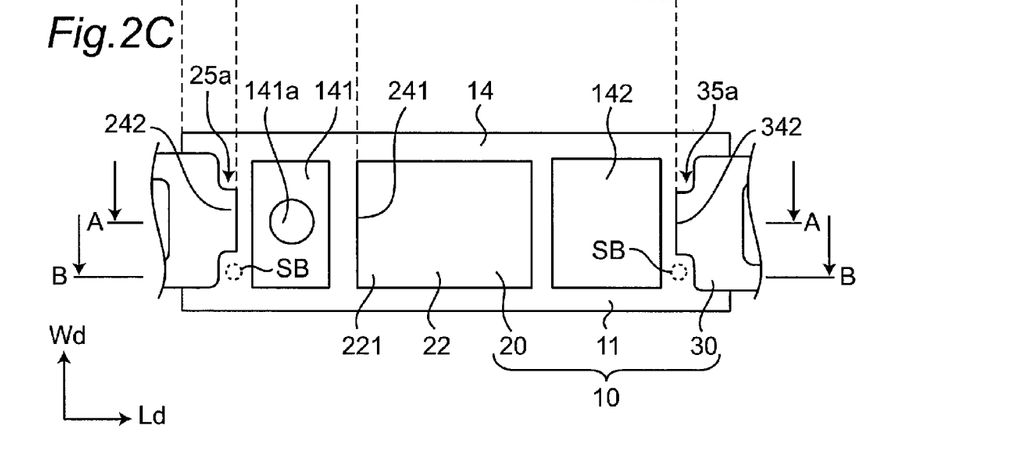
FIG. 2C is a bottom view of the molded package according to the first embodiment.

The first lead 20 has cutouts 25a formed from the front surface 21 to the rear surface 22 along opposing two sides extending in the Ld direction. As shown in FIG. 2, the cutouts 25a have a substantially rectangular shape, and are formed on both of the two sides in the Ld direction. These cutouts 25a may be advantageous when molding the molded resin 11. For example, a molten resin for the molded resin 11 may be injected at a position of the lead recess 24 (described below). In this case, the molten resin flows laterally from the lead recess 24 toward the cutouts 25a along the rear surface 22 of the first lead 20. Also, part of the molten resin flows through the cutouts 25a to the front surface 21 of the first lead 20, and further flows laterally along the front surface 21. In this way, since the molten resin easily flows along the front surface 21 and rear surface 22 of the first lead 20 through the cutouts 25a, it can be achieved to obtain the molded package 10 having no or less defect (gap) between the first lead 20 and the molded resin 11.

The cutout 25a is formed so as to be at least partially located under the side wall 13 of the molded resin 11. As a result, the cutout 25a can be filled with a part of the molded resin 11.

Figure 4A:
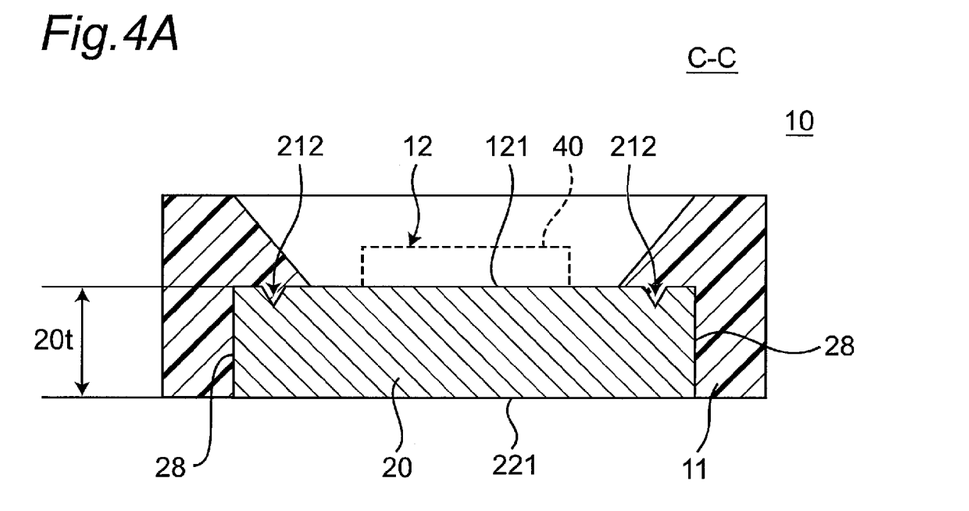
FIG. 4A is a cross-sectional view taken along line C-C of FIG. 2A.
Figure 4B:
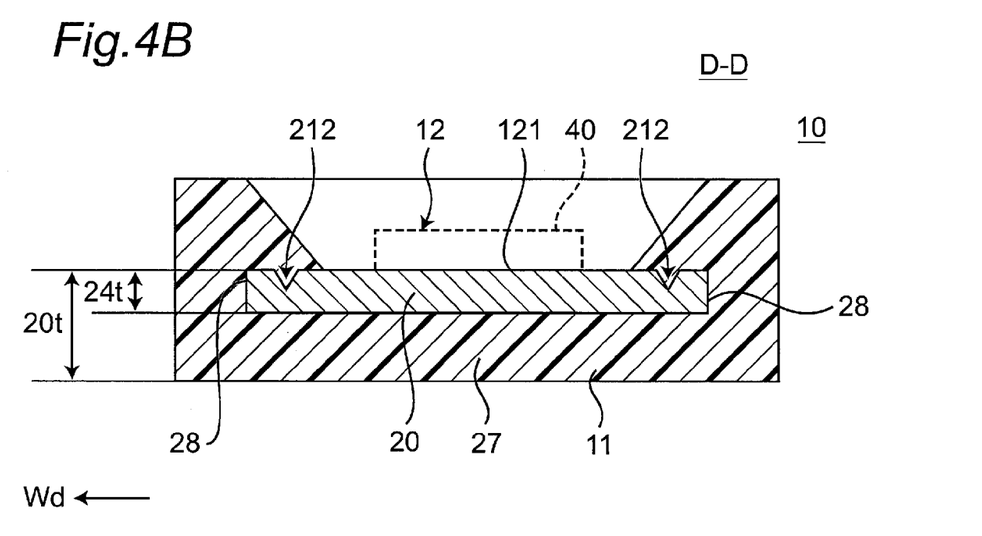
FIG. 4B is a cross-sectional view taken along line D-D of FIG. 2A.

The cutout 25a is effective in enhancement of a bonding strength between the first lead 20 and the molded resin 11. A circumferential length of the first lead 20 can be extended by forming the cutout 25a in the first lead 20. Furthermore, the contact area between a side surface 28 (FIG. 4) of the first lead 20 and the molded resin 11 can be increased by filling the cutout 25a with the part of the molded resin 11. For this reasons, the bonding strength between the first lead 20 and the molded resin 11 is enhanced by the cutout 25a.

Among edges of the cutout 25a at the rear surface 22, an edge (a first edge 251b) closer to a center of the recess 12 (on a side of the light emitting element 40), i.e. the edge most adjacent to the light emitting element 40 in the longitudinal direction Ld, is located inside the lead recess 24 and covered with the resin 27. With this, the first edge 251b of the cutout 25a (at the rear surface 22) are not exposed from the rear surface 14 of the molded resin 11, thereby suppressing that soldering flux penetrates from a boundary between the first edge 251b and the molded resin 11 when reflowing the light emitting device.

There is still a possibility of the soldering flux penetrating from a boundary 241 between the lead recess 24 and the resin 27 at the rear surface 22 of the first lead 20. However, in order to penetrate from the boundary 241 to the recess 12, the soldering flux has to go through "a penetration path of the soldering flux" that starts from the boundary 241 between the lead recess 24 and the resin 27, passes through an interface between the lead recess 24 and the resin 27, further passes through an interface between the cutout 25a and the molded resin 11, and reaches a boundary 251a between the cutout 25a and the molded resin 11 at the front surface 21 of the first lead 20 (FIG. 3B). That is, the penetration path of the soldering flux can be lengthened compared to the conventional art by placing the first edge 251b of the cutout 25a at the rear surface 22 inside the lead recess 24 to be covered with resin 27. As a result, it can be prevented or suppressed that the soldering flux penetrates into the recess 12.

The resin 27 that fills the lead recess 24 is preferably continuous from the rear surface 14 of the molded resin 11. As one example, the resin 27 that fills the lead recess 24 may be formed integrally with the molded resin 11. For example, the resin 27 is formed as a part of the molded resin 11 so as to join the resin 27 with the molded resin 11. That is, the molded resin 11 bonds to the front surface 21, the side surface 28 and the rear surface 22 of the first lead 20. With this, a bonding strength between the first lead 20 and the molded resin 11 can be enhanced.

For another example, the resin 27 may extend over the first lead 20 in the width direction (a Wd direction) (FIG. 4B). Specifically, the lead recess 24 is provided over the first lead 20 in the Wd direction, and the inner surface of the lead recess 24 is covered with the resin 27. As shown in FIG. 4B, the first lead 20 is surrounded with the resin 27 and the molded resin 11 except for a part exposed from the bottom 121 of the recess 12. It can thus be achieved to further enhance the bonding strength between the first lead 20 and the molded resin 11.

The light emitting element 40 may be placed between the cutout 25a and a first end 26 of the first lead 20 (an end opposed to the second lead 30) so that the resin 27 is not located immediately below the mounting position of the light emitting element 40. In other words, the rear surface 22 of the first lead 20 immediately below the mounting position of the light emitting element 40 is exposed from the rear surface 14 of the molded resin 11. As a result, the heat generated by the light emitting element 40 is thus efficiently dissipated from the rear surface 22 of the first lead 20.

As with the first lead 20, the second lead 30 also has cutouts 35a formed from the front surface 31 to the rear surface 32 along opposing two sides extending in the Ld direction. The cutout 35a is formed so as to be at least partially located under the side wall 13 of the molded resin 11, and the cutout 35a is completely filled with a part of molded resin 11. For this reasons, a bonding strength between the second lead 30 and the molded resin 11 is enhanced.

Also, as with the first lead 20, among edges of the cutout 35a at the rear surface 22, an edge (a first edge 351b) closer to the center of the recess 12 (on the side of the light emitting element 40) may be located inside the lead recess 34 and covered with the resin 37. With this, the first edge 351b of the cutout 35a is not exposed from the rear surface 14 of the molded resin 11, thereby suppressing that the soldering flux penetrates from a boundary between the first edge 351b and the molded resin 11 when reflowing the light emitting device.

Since the light emitting element 40 is not mounted on the second lead 30, it is considered that there is less negative influence of the soldering flux penetrating into the recess 12 of the molded resin 11. With this, as for the second lead 30, the first edge 351b of the cutout 35a (at the rear surface 32) may be exposed from the rear surface 14 of the molded resin 11 without providing the lead recess 34 and the resin 37.

If the lead recess 34 and the resin 37 are provided on the rear surface 32 of the second lead 30, they may be provided all over the area immediately below the recess 12 of the molded resin 11 (FIGS. 2B and 3B). That is, the rear surface 32 of the second lead 30 may not be exposed from the rear surface 14 of the molded resin 11 immediately below the recess 12 of the molded resin 11. This is because the light emitting element 40 is not mounted on the second lead 30, and it is thus not needed to dissipate the heat from the rear surface 32 of the second lead 30 to outside. The rear surface 32 of the second lead 30 may be exposed for electrical connection with an external terminal.

As with the first lead 20, the resin 37 that fills the lead recess 34 may be formed integrally with the molded resin 11. For example, the resin 37 is formed as part of the molded resin 11 so as to join the resin 37 with the molded resin 11. With this, a bonding strength between the second lead 30 and the molded resin 11 can be enhanced.

Furthermore, the resin 37 may extends over the second lead 30 in the width direction (the Wd direction). Specifically, the lead recess 34 is provided over the second lead 30 in the Wd direction, and filled with the resin 37. As with the first lead 20 shown in FIG. 4B, the second lead 30 is surrounded with the resin 27 and the molded resin 11 except for a part exposed from the bottom 121 of the recess 12. It can thus be achieved to further enhance the bonding strength between the second lead 30 and the molded resin 11.

Figure 5A:
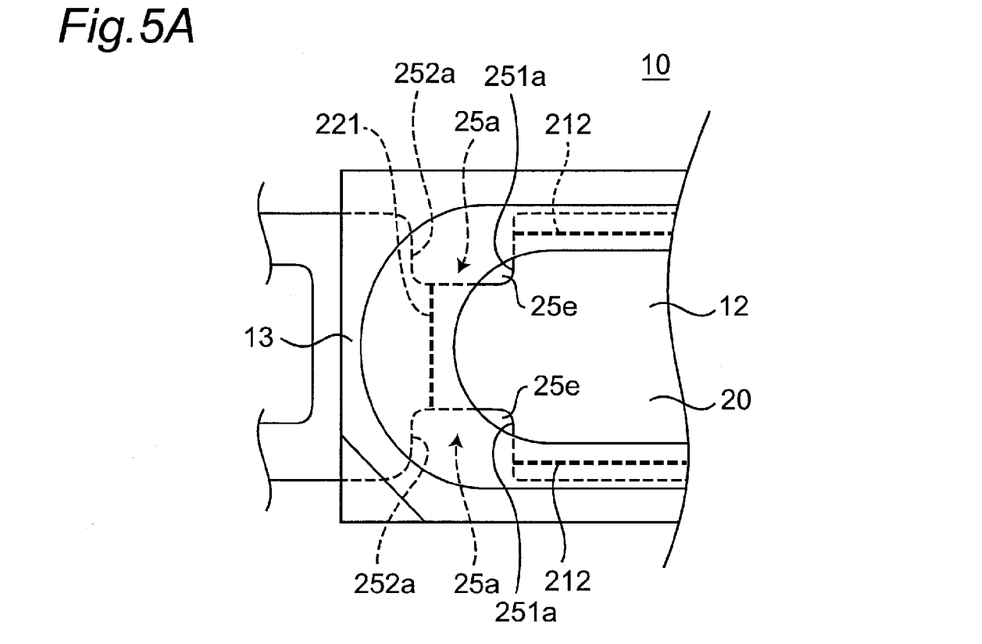
FIG. 5A is a partial enlarged top view of the molded package according to the first embodiment.

As shown in FIGS. 3B and 5A, at the front surface 21 of the first lead 20, a first edge 251a of the cutout 25a may be exposed from the bottom surface 121 of the recess 12 of the molded resin 11, and a second edge 252a (an edge opposed to the first edge 251a) of the cutout 25a may be covered with the side wall 13. That is, as shown in FIG. 5A, a part of the molded resin 11 (a part 25e) filled in the cutout 25a is exposed from the bottom 121 of the recess 12. The part 25e join with a sealing resin 52 (FIG. 7B) described below when manufacturing the light emitting device 50. The sealing resin 52 adheres to the molded resin 11 more strongly than to the first lead 20. As a result, the bonding strength between the sealing resin 52 and the molded package 10 may be enhanced by joining the sealing resin 52 and the part 25e.

If it is hard for the soldering flux to reach the first edge 251a of the cutout 25a (at the front surface 21), or if the first edge 251a is apart from the light emitting element 40 (i.e. it is estimated that a negative influence of the soldering flux is small), it is preferable that the cutouts 25a are partially exposed from the recess 12 of the molded resin 11 as shown in FIG. 5A.

Since the first lead 20 is narrowed at the position of the cutouts 25a, a strength thereof is locally decreased. It is thus preferable to cover the second edges 252a of the cutouts 25a with the side wall 13 of the molded resin 11 so as to reinforce the narrowed part the first lead 20.

Figure 5B:
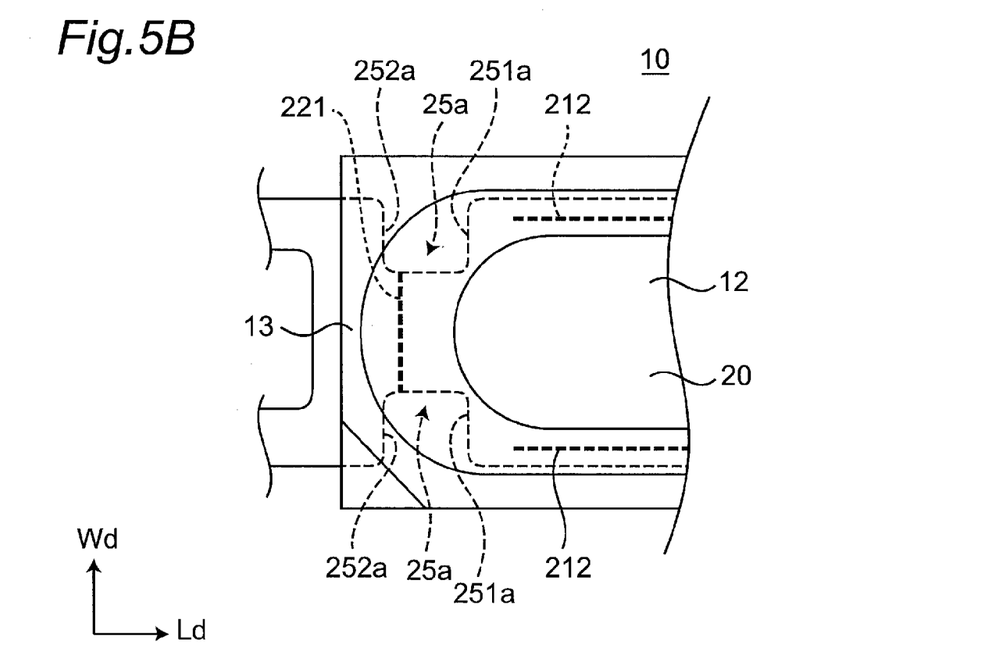
FIG. 5B is a partial enlarged top view of the molded package according to the first embodiment.

Alternatively, the cutouts 25a may be fully covered with the side wall 13 of the molded resin 11 as shown in FIG. 5B. Since the first edge 251a of the cutout 25a (at the front surface 21) is covered with the molded resin 11 at the front surface 21 of the first lead 20, the penetration path of the soldering flux can be lengthened by a length from the first edge 251a to the recess 12 of the molded resin 11. As a result, it can be suppressed that the soldering flux penetrates into the recess 12 of the molded resin 11. Also, there is also an effect that the narrowed part of the first lead 20 is wholly reinforced by the side wall 13 of the molded resin 11.

If the soldering flux easily reaches the first edge 251a of the cutout 25a at the front surface 21, or if the first edge 251a at the front surface 21 is close to the light emitting element 40 (i.e. negative influence of the soldering flux is estimated large), it is preferable that the cutout 25a is fully covered with the side wall 13 of the molded resin 11 as shown in FIG. 5B.

As for the cutout 35a of the second lead 30, the first edge 351a of the cutout 35a (at the front surface 31) also may or may not be exposed for the same reason as the case of the first lead 20.

For example, if it is hard for the soldering flux to reach the first edge 351a of the cutout 35a, or if the first edge 351a are apart from the light emitting element 40 (i.e. it is estimated that a negative influence of the soldering flux is small), it is preferable that the cutout 35a are partially exposed from the recess 12 of the molded resin 11.

In contrast, if the soldering flux easily reach the first edge 351a of the cutout 35a or the first edge 351a is close to the light emitting element 40 (i.e. negative influence of the soldering flux is estimated small), it is preferable that the cutout 35a is fully covered with the side wall 13 of the molded resin 11.

In the present embodiment, the cutouts 25a and 35a are formed in an approximately rectangular shape, however they may be formed in any shape such as polygonal or partially circular (e.g. semicircular) shape. Further, in the present embodiment, the cutouts 25a and 35a are formed on both of the two sides along the Ld direction; however they may be formed only on one side of them.

Figure 6:
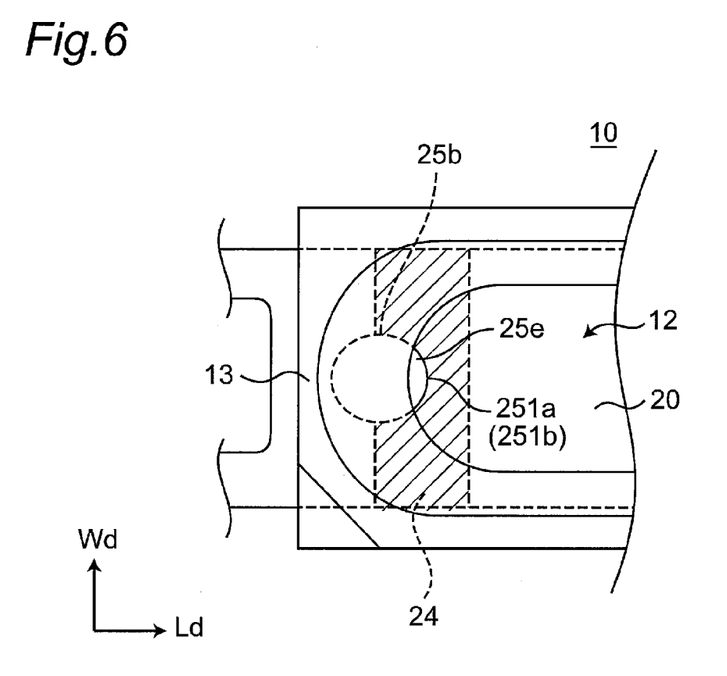
FIG. 6 is a partial enlarged top view of the molded package according to the first embodiment.

As a modification, a through hole 25b as shown in FIG. 6 may be provided in replace of the cutouts 25a of the first lead 20 shown in FIGS. 2A to 5. Since the strength of a first lead 20 with the through hole 25b is less decreased locally compared to one with the cutouts 25a, this modification is suitable when it is desired to keep the strength of the first lead 20. In contrast, if it is difficult to form the through hole 25b by any reason, for example, when the width (size in the Wd direction) of the first lead 20 is too narrow to form the through hole 25b at a suitable position, it is preferable to provide the cutouts 25a.

As with the cutouts 25a, among the edges of the through hole 25 of the first lead 20 at the rear surface, an edge (the first edge 251b) closer to the center of the recess 12 (on the side of the light emitting diode 40) is located inside the lead recess 24 and covered with resin. With this configuration, the first edge 251b (at the rear surface 22) of the through hole 25 is not exposed from the rear surface 14 of the molded resin 11. It can thus be suppressed that the soldering flux penetrates from the boundary between the first edge 251b and the molded resin 11 in reflowing the light emitting device.

Furthermore, since the first edge 251b of the through hole 25 at the rear surface 22 is located inside the lead recess 24 so as to be covered with the resin, the penetration path of the soldering flux can be lengthened compared to the conventional art. It can thus be suppressed that the soldering flux penetrates into the recess 12.

For the same reason as in the cutouts 25a and 35a, the first edge 251b of the through hole 25 at the rear surface 22 may or may not be exposed.

For example, if it is hard for the soldering flux to reach the first edge 251a of the through hole 25 at the front surface 21, or if the first edge 251a at the front surface 21 is apart from the light emitting element 40 (i.e. it is estimated that a negative influence of the soldering flux is small), it is preferable that the through hole 25 is partially exposed from the recess 12 of the molded resin 11.

In contrast, if the soldering flux easily reaches the first edge 251a of the through hole 25 at the front surface 21 or the first edge 251a is close to the light emitting element 40 (i.e. negative influence of the soldering flux is estimated large), it is preferable that the through hole 25 is fully covered with the side wall 13 of the molded resin 11.

In the present embodiment, the through hole 25 has an oval shape, however, it may have any shape such as perfect-circular or polygonal (triangular, rectangular or the like) shape.

Although not shown in the drawings, a second lead 30 may also be provided with the same through hole as the through hole 25b in replace of the cutout 35a.

In terms of the heat dissipation properties of the first lead 20, it is preferable that an exposed area of the rear surface 22 of the first lead 20 which is exposed from the rear surface 14 is larger. On the contrary, in terms of preventing the soldering flux from penetrating from the cutouts 25a, it is preferable that at least the first edges 251b of the cutouts 25a (at the rear surface 22) are not exposed from the rear surface 14 of the molded resin 11.

Figure 7:
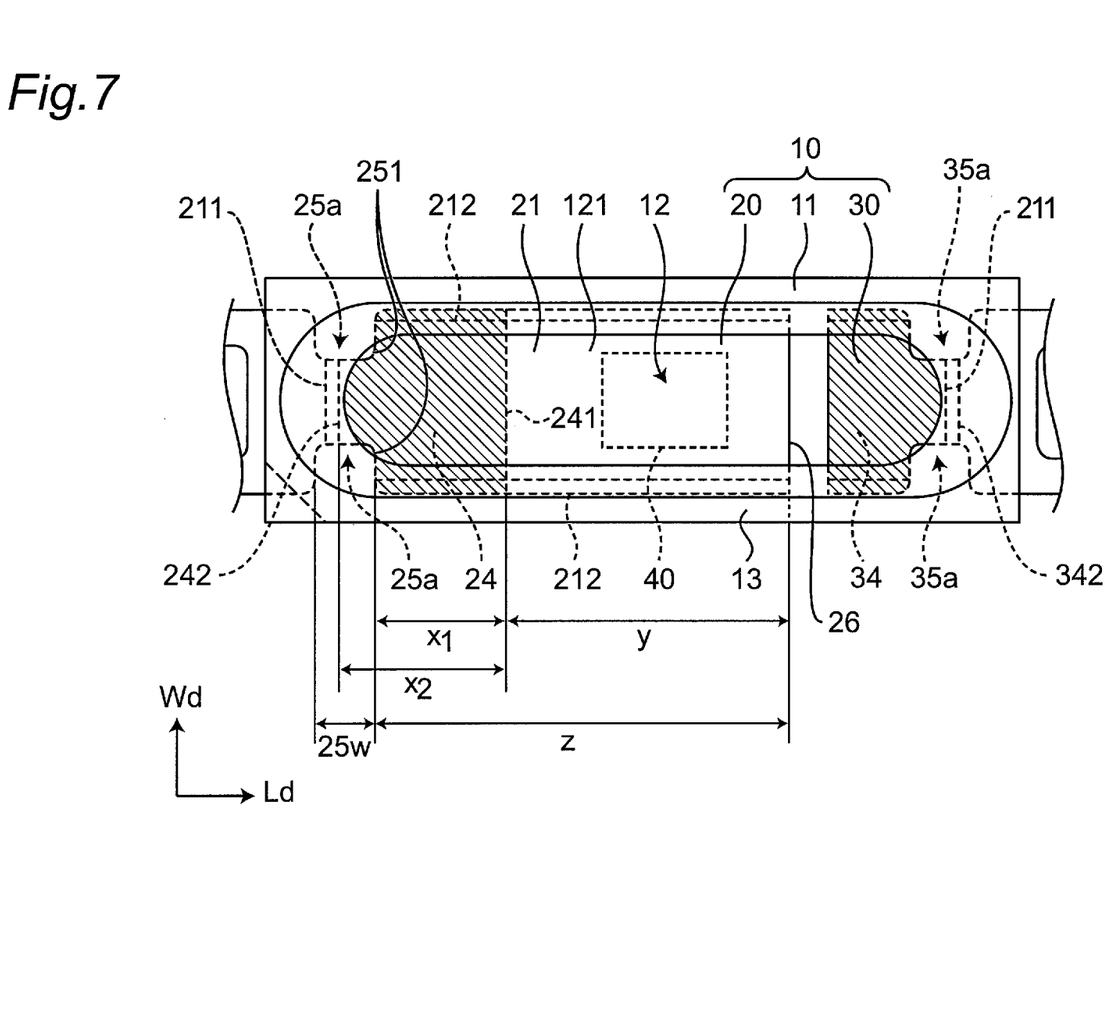
FIG. 7 is a top view of the molded package according to the first embodiment.

For this reason, as shown in FIG. 7, a distance y is preferably 50% to 80% of a distance z, where the distance y is a distance from the first end 26 of the first lead 20 to the end 241 of the lead recess 24 closer to the center of the recess 12 (on the side of the light emitting element 40), and the distance z is a distance from the first end 26 of the first lead 20 to the first edges 251b of the cutouts 25a. If the proportion is less than 50%, the heat dissipation properties may be decreased since the lead recess 24 and the resin 27 are provided immediately below the light emitting element 40. If the proportion is over 80%, the effect of preventing the soldering flux from penetrating from the first edges 251b may be reduced since only the very vicinity of the first edges 251b of the cutouts 25a is covered with the resin 27.

In terms of heat dissipation properties and protection from the soldering flux, the dimension of each part shown in FIG. 7 may be within the following ranges.

The length $x_1$ from the end 241 of the lead recess 24 to the first edges 251b of the cutouts 25a is preferably 0.1 to 1.4 mm.

If the length $x_1$<0.1 mm, the penetration path of solder flux is not long enough and solder flux penetrates from the first edges 251b more easily. If the length $x_1$>1.4 mm, the heat dissipation properties decrease.

The length $x_2$ of the lead recess 24 in the longitudinal direction Ld is preferably 0.4 to 1.6 mm. If the length $x_2$<0.4 mm, the bonding between the first lead 20 and the molded resin 11 may be weakened. If the length $x_2$>1.6 mm, the heat dissipation properties decrease.

Furthermore, in terms of the strength of the first lead 20, the dimension of each part shown in FIGS. 4A, 4B and 7 may be within the following ranges.

The plate thickness 24t of the first lead 20 at the position of the lead recess 24 is preferably 25% to 60% of the plate thickness 20t of the first lead 20 (FIGS. 4A and 4B). If the proportion is less than 25%, the first lead 20 is weakened at the position of the lead recess 24, which causes warpage of the first lead 20. If the molded package 10 is formed with such warped first lead 20, the molded resin 11 easily has a crack. If the proportion is over 60%, the acceptable thickness of the resin 27 that is filled in the lead recess 24 becomes thin, and the resin 27 easily has a crack.

The dimension of the cutouts 25a in the longitudinal direction Ld (the width 25w of the cutouts 25a) is preferably 0.3 to 0.9 mm. If the width 25w<0.3 mm, the bonding between the first lead 20 and the molded resin 11 may be weakened. If the width 25w>0.9 mm, the first lead 20 becomes weak locally at the narrowed part where the cutouts 25a are formed, which causes warpage of the first lead 20. If the molded package 10 is formed with such warped first lead 20, the molded resin 11 easily has a crack (FIG. 7).

The lengths $x_1$ and $x_2$ and the width 25w of the cutouts 25a shown in FIG. 7 determine the positional relationship between the cutouts 25a and lead recess 24.

Figure 8A:
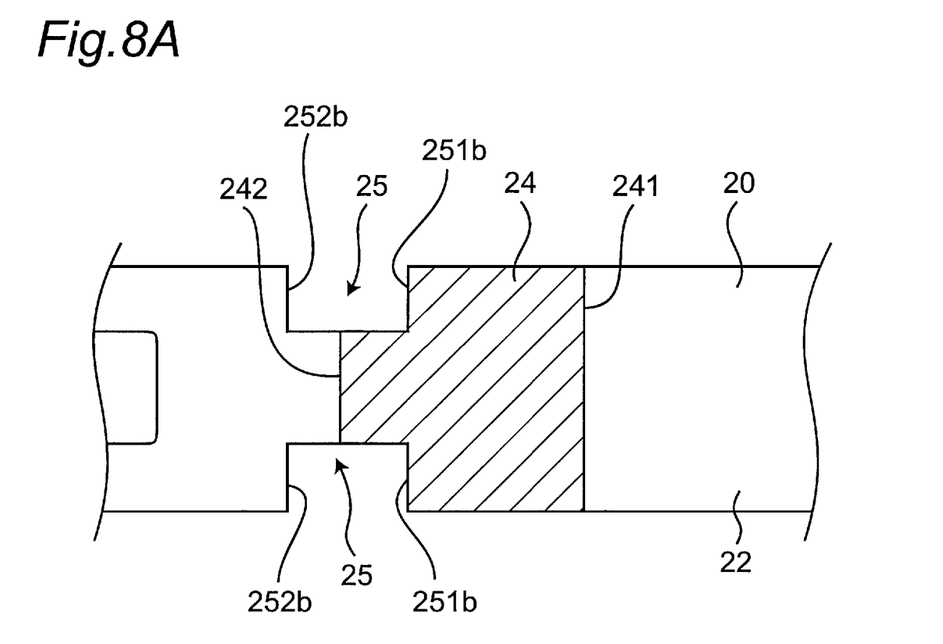
FIG. 8A is a schematic bottom view of a lead that is used in the molded package according to the first embodiment.

For example, if width 25w≥(length $x_2$−length $x_1$), second edges 252b of the cutouts 25a are located outside the lead recess 24 (FIG. 8A).

If the dimensions are determined so as to satisfy this condition, the narrowed part by the cutouts 25a is partially left to have the thickness 20t. That is, it can be mitigated that the weak narrowed part is further weakened by the lead recess 24. This configuration is thus suitable when it is desired to keep the strength of the first lead 20.

Figure 8B:
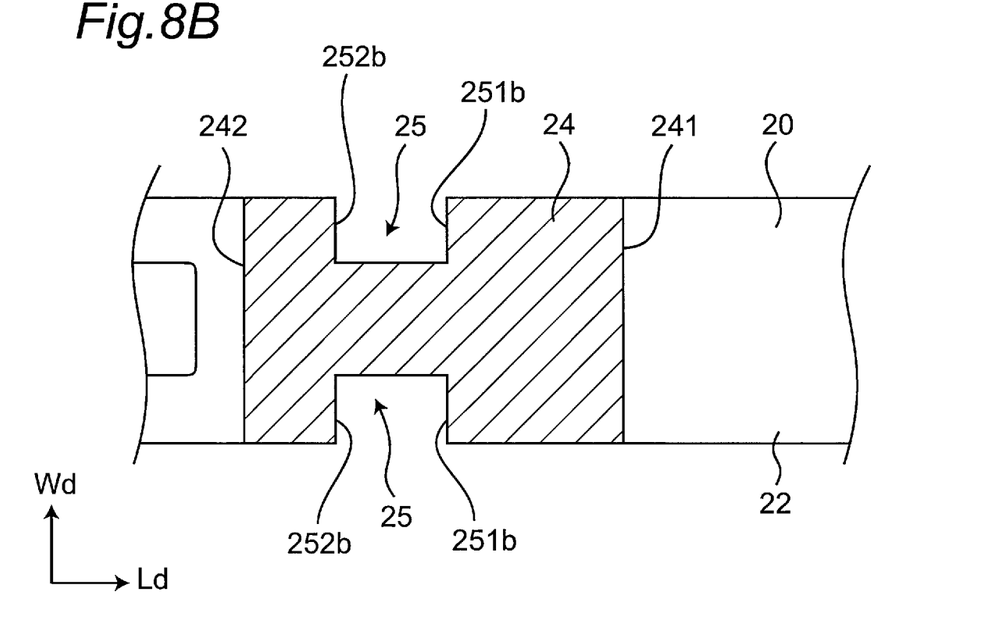
FIG. 8B is a schematic bottom view of the lead that is used in the molded package according to the first embodiment.

On the contrary, if width 25w<(length $x_2$−length $x_1$), the second edges 252b of the cutouts 25a are located inside the lead recess 24 and covered with the resin (FIG. 8B).

If the dimensions are determined so as to satisfy this condition, the second edges 252b of the cutouts 25a can be covered with the resin 27. It can be thus achieved to suppress solder flux from penetrating from the second edges 252b.

The above-described dimensions are to define the cutouts 25a of the first lead 20, and the dimension of the cutout 35a of the second lead 30 and the positional relationship between the cutout 35a and lead recess 34 may be determined in the same way. Furthermore, when the through hole 25a and 35a is formed in the first and second leads 20 and 30 in replace of the cutouts 25a and 35a of the respective leads, the dimension of the through hole 25b and the positional relationship between the through hole 25b and lead recess 24 may be determined in the same way.

Referring to FIGS. 2C, 3A and 3B, the resin 27, which covers the first edges 251b of the cutouts 25a of the first lead 20 at the rear surface 22, may have a recess 141 that corresponds to the lead recess of the molded package 10 at the rear surface 14. This recess 141 is considered to be effective in eliminating defective mount of the light emitting device as described below.

When the light emitting device using this molded package 10 is mounted on the mounting substrate by reflow, melted solder spontaneously concentrates to the exposed surface 21 of the first lead 20 since the melted solder has low wettability to the molded resin 11. However, the melted solder may sometimes stay on the molded resin 11 to form a solder ball. If the light emitting device is mounted on the mounting substrate as it is lifted up by the solder ball, it results defective mount of the light emitting device.

Such solder ball SB tends to be formed at an irregular rim of the molded resin 11. In the molded package 10 of the present embodiment, it tends to be formed around the cutouts 25a (FIG. 2C). To cope with this, the resin 27, which covers the first edges 251b of the cutouts 25a, is provided with the recess 141, and the solder ball SB is then drawn to this recess 141 and spreads over this recess in reflow. The light emitting device can be thus prevented from lifting up from the mounting substrate.

As for the second lead 30, the resin 37, which covers the first edge 351b of the cutout 35a, may also be provided with a recess 142 that corresponds to the lead recess of the molded package 10 at the rear surface 14 for the same reason as with the first lead 20.

When manufacturing, a gate for molten resin may be set to the lead recess 24 to inject the molten resin for the molded resin 11 and the resin 27. Such gate may leave a mold flash 141a after curing the resin. The mold flash 141a is supposed to be removed since it causes defective mount of the light emitting device. However, by providing the recess 141 to the resin 27, it can be omitted to remove the mold flash 141a if the height of the mold flash 141a is lower than the depth of the recess 141.

Surface grooves 211 and 212 may be provided to the front surfaces 21 and 31 of the first and second leads 20 and 30. The surface grooves 211 and 212 are covered with the side wall 13 of the molded resin 11. The surface groove 211, which extends in the width direction Wd, is formed between the first edge 251a and second edges 252a of the cutouts 25a. The surface grooves 211 and 212 are expected to provide an effect of suppressing the solder flux from spreading by capturing the solder flux flowing on the front surfaces 21 and 31 of the first and second leads 20 and 30, as well as an effect of enhancing the bonding strength between the first and second leads 20 and 30 and the molded resin 11 by increasing the contact area between the front surfaces 21 and 31 and the molded resin 11.

A method for manufacturing the light emitting device 50 will be described below.

<1. Manufacturing of Molded Package 10>

Figure 9A:
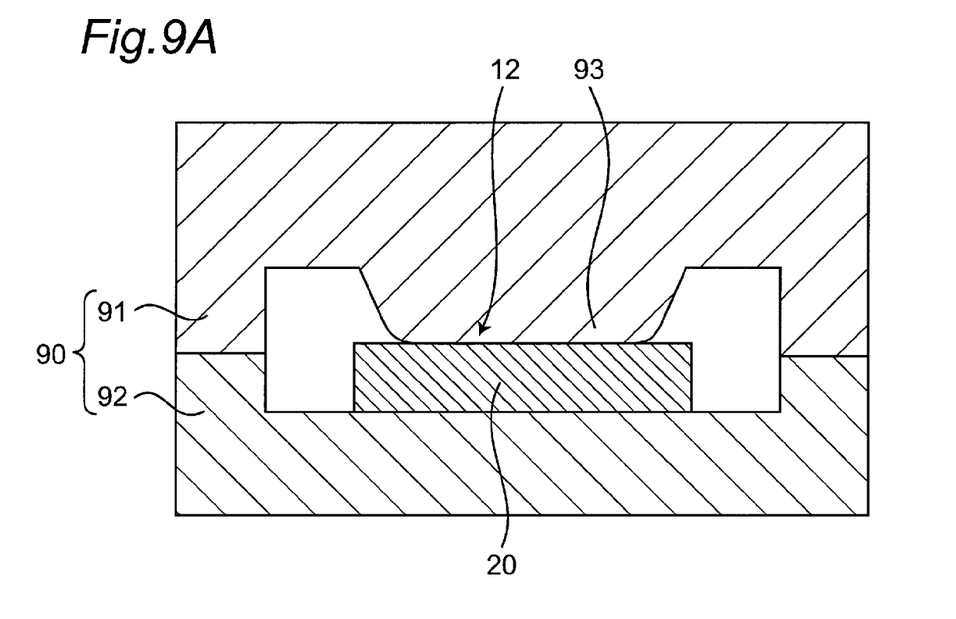
FIG. 9A is a schematic cross-sectional view for explaining a method for manufacturing the light emitting device according to the first embodiment.
Figure 9B:
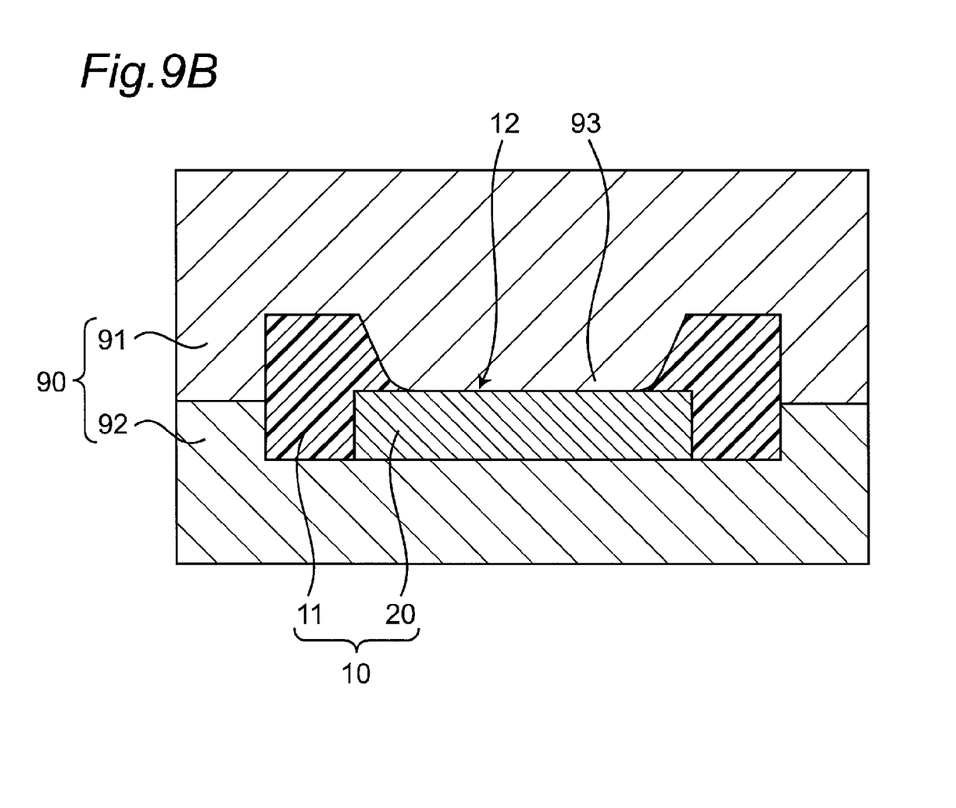
FIG. 9B is a schematic cross-sectional view for explaining a method for manufacturing the light emitting device according to the first embodiment.

A lead frame including a plurality of pairs of the first lead 20 and second lead 30 which are oppositely disposed to each other was punched out from a metal plate. The cutouts 25a and 35a may be formed concurrently at the time of punching. The first lead 20 and second lead 30 are coupled to the lead frame with tie-bars. Subsequently, the lead recesses 24 and 34 are formed at predetermined positions on the rear surfaces 22 and 32 of the first lead 20 and second lead 30 by wet etching or hammering. The lead frame LF is sandwiched by a metal die 90 that has a room for the molded resin 11 at a position corresponding to each lead pair (FIG. 9A). Then, resin material for the molded resin 11 is injected to the room of the metal die 90 from a molten resin gate for molten resin that is set in the lead recess 24. The metal die 90 is taken off after the resin material is cured. The molded package 10 that is fixed on the lead frame is thus obtained.

<2. Mounting of Light Emitting Element 40>

The light emitting device 40 shown in FIG. 1 has a pair of electrodes, either of which is provided on the upper surface. The light emitting element 40 of such type is mounted on the first lead 20 of the molded package 10 by die bonding. One electrode of the light emitting element 40 is electrically connected with the first lead 20 and the other electrode with the second lead 30 with bonding wires BWs.

A light emitting element having a first electrode on the upper surface and a second electrode on the bottom surface may also be used. In this case, the bottom surface is fixed onto the first lead 20 with conductive paste so as to electrically connect the second electrode with the first lead 20. The first electrode on the upper surface is electrically connected to the second lead 30 with a bonding wire BW.

<3. Filling of Sealing Resin 52>

Liquid state sealing resin is dropped into the recess 12 of the molded package 10 by potting, and then cured. If the sealing resin 52 is formed into two layers, first sealing resin (underfill) is firstly dropped into the recess 12 and cured, and then second sealing resin (overfill) is dropped into the recess 12 and cured.

<4. Splitting of Light Emitting Elements 50 into Each Piece>

The tie-bars of the lead frame are cut by dicing so as to separate out each light emitting element 50.

Suitable material of each component of the light emitting element 50 will be described below.

(First Lead 20 and Second Lead Electrode 30)

The first lead 20 and second lead electrode 30 may be made of a conductive material that is composed of at least one of aluminum, iron, nickel, copper and the like in terms of processability and strength. It is preferable that the first lead 20 and second lead 30 are plated with gold, silver or an alloy thereof, or the like.

(Molded Resin 11)

The molding material of the molded resin 11 may be, for example, a thermoplastic resin such as an epoxy resin or a silicone resin, or a thermosetting resin such as a liquid crystal polymer, a polyphthalamide resin or polybutylene terephthalate (PBT). Further, a white pigment such as titanium oxide may be mixed with the molding material in order to increase light reflectance inside the recess 12 of the molded resin 11.

(Bonding wire BW)

The bonding wire BW may be, for example, a metal wire made of a metal such as gold, silver, copper, platinum or aluminum or an alloy thereof.

(Sealing Resin 52)

The material of the sealing resin may be a silicone resin, an epoxy resin, an acrylic resin, or a resin containing at least one of them. The sealing resin 52 may be composed of a single layer, or may be composed of a plurality of layers (e.g. two layers of an underfill and overfill).

Further, light scattering particles such as titanium oxide, silicon oxide, titanium dioxide, zirconium dioxide, alumina or aluminum nitride may be dispersed in the sealing layer 52.

Furthermore, particles of a substance (phosphor or the like) that converts the wavelength of the light emitted from the light emitting element 40 may be dispersed in the sealing layer 52. For example, for a light emitting device 50 that emits white light, a light emitting element 40 that emits blue light may be combined with phosphor particles (e.g. YAG particles) that absorb the blue light to emit yellow light.

(Solder)

The solder of the present embodiment may be Sn—Ag—Cu, Sn—Zi—Bi, Sn—Cu, Pb—Sn, Au—Sn, Au—Ag or the like.

According to the molded package 11, the first edges 251b of the cutouts 25a of the first lead 20 closer to the light emitting element 40 at the rear surface 22 are located inside the lead recess 24 so as to be covered with the resin 27. Therefore, when the light emitting device 50 is manufactured and mounted using the molded package 11, it can be suppressed that solder flux penetrates from the first edges 251b of the cutouts 25a.

Furthermore, according to the molded package 11, the rear surface 22 of the first lead 20 is exposed from the rear surface 14 of the molded resin 11. Therefore, when the light emitting device 50 is manufactured using the molded package 11, it can be achieved to efficiently dissipate the heat from the light emitting element 40 that is mounted on the front surface 21 of the first lead 20 to outside.

What is claimed is:

1. A molded package, comprising:
a molded resin comprising a recess for accommodating a light emitting element; and
first and second leads disposed at a bottom of the molded resin and separated from each other by a gap,
one surface of the first lead being partially exposed from a bottom surface of the recess of the molded resin,
the other surface of the first lead including an exposed part and a lead recess, the exposed part being exposed from a rear surface of the molded resin, the lead recess comprising a resin fully covering an inner surface thereof,
the one surface and the other surface of the first lead being substantially planar,
the first lead including a cutout or a through hole extending from the one surface to the other surface,
at least a portion of a first edge of the cutout or the through hole closer to a center of the recess at the other surface being located inside the lead recess and covered with the resin.

2. The molded package according to claim 1, wherein the resin filling the lead recess continues from the rear surface of the molded resin.

3. The molded package according to claim 1, wherein a second edge of the cutout or the through hole at the other surface of the first lead opposed to the first edge is located outside the lead recess.

4. The molded package according to claim 1, wherein at least a portion of a second edge of the cutout or the though hole at the other surface of the first lead opposed to the first edge is located inside the lead recess and is covered with the resin.

5. The molded package according to claim 1, wherein at least a portion of the first edge of the cutout or the through hole at the one surface of the first lead is exposed from the bottom surface of the recess, and at least a portion of a second edge of the cutout or through hole opposed to the first edge is covered with a side wall forming the recess of the molded resin.

6. The molded package according to claim 1, wherein the cutout or the through hole is covered with a side wall at the one surface of the first lead, the side wall forming the recess of the molded resin.

7. The molded package according to claim 1, wherein one surface of the second lead is at least partially exposed from the bottom surface of the recess of the molded resin,
one surface of the first lead includes an area for mounting the light emitting element between a first end of the first lead opposed to the second lead and the first edge of the cutout or the through hole,
the other surface of the first lead includes the exposed part and the lead recess, the exposed part is exposed from the rear surface of the molded resin, the lead recess is filled with the resin fully covering the inner surface thereof,
at the other surface of the first lead, a distance y is a distance from the first end of the first lead to an end of the lead recess closer to the light emitting element, a distance z is a distance from the first end of the first lead to the first edge of the cutout or the through hole, and the distance y is 50% to 80% of the distance z.

8. The molded package according to claim 1, wherein the molded package comprises an elongated shape in one direction, and
the cutout or the through hole is a cutout formed on a side extending along the one direction.

9. The molded package according to claim 1, wherein the first lead includes a surface groove on the one surface, the surface groove being formed between the first edge of the cutout or the through hole and a second edge opposed to the first edge, and covered with a side wall forming the recess of the molded resin.

10. The molded package according to claim 1, wherein the resin filling the lead recess is dented corresponding to the lead recess at a rear surface of the molded package.

11. The molded package according to claim 1, wherein the cutout or the though hole is a through hole.

12. The molded package according to claim 1, wherein the cutout or the though hole is a cutout.

13. A light emitting device comprising:
the molded package according to claim 1;
a light emitting element being accommodated in the recess formed on the molded resin of the molded package and mounted on the one surface of the first lead exposed from the bottom surface of the recess; and
a sealing resin for sealing the light emitting element and the recess of the molded resin.

14. A molded package, comprising:
a molded resin comprising a recess for accommodating a light emitting element; and
first and second leads disposed at a bottom of the molded resin and separated from each other by a gap,
one surface of the first lead being partially exposed from a bottom surface of the recess of the molded resin,
the other surface of the first lead including an exposed part and a lead recess, the exposed part being exposed from a rear surface of the molded resin, the lead recess comprising a resin fully covering an inner surface thereof,
the first lead including a cutout at at least one side of the first lead extending from the one surface to the other surface,
at least a portion of a first edge of the cutout closer to a center of the recess at the other surface being located inside the lead recess and covered with the resin.

15. The molded package according to claim 14, wherein the resin filling the lead recess continues from the rear surface of the molded resin.

16. The molded package according to claim 14, wherein a second edge of the cutout at the other surface of the first lead opposed to the first edge is located outside the lead recess.

17. The molded package according to claim 14, wherein at least a portion of a second edge of the cutout at the other surface of the first lead opposed to the first edge is located inside the lead recess and is covered with the resin.

18. The molded package according to claim 14, wherein at least a portion of the first edge of the cutout at the one surface of the first lead is exposed from the bottom surface of the recess, and at least a portion of a second edge of the cutout opposed to the first edge is covered with a side wall forming the recess of the molded resin.

19. The molded package according to claim 14, wherein the cutout is covered with a side wall at the one surface of the first lead, the side wall forming the recess of the molded resin.

20. The molded package according to claim 14, wherein one surface of the second lead is at least partially exposed from the bottom surface of the recess of the molded resin,
   one surface of the first lead includes an area for mounting the light emitting element between a first end of the first lead opposed to the second lead and the first edge of the cutout,
   the other surface of the first lead includes the exposed part and the lead recess, the exposed part is exposed from the rear surface of the molded resin, the lead recess is filled with the resin fully covering the inner surface thereof,
   at the other surface of the first lead, a distance y is a distance from the first end of the first lead to an end of the lead recess closer to the light emitting element, a distance z is a distance from the first end of the first lead to the first edge of the cutout, and the distance y is 50% to 80% of the distance z.

21. The molded package according to claim 14, wherein the molded package comprises an elongated shape in one direction, and the cutout is a cutout formed on a side extending along the one direction.

22. The molded package according to claim 14, wherein the first lead includes a surface groove on the one surface, the surface groove being formed between the first edge of the cutout and a second edge opposed to the first edge, and covered with a side wall forming the recess of the molded resin.

23. The molded package according to claim 14, wherein the resin filling the lead recess is dented corresponding to the lead recess at a rear surface of the molded package.

24. A light emitting device comprising:
   the molded package according to claim 14;
   a light emitting element being accommodated in the recess formed on the molded resin of the molded package and mounted on the one surface of the first lead exposed from the bottom surface of the recess; and
   a sealing resin for sealing the light emitting element and the recess of the molded resin.

* * * * *